United States Patent [19]
Miura et al.

[11] Patent Number: 6,080,611
[45] Date of Patent: Jun. 27, 2000

[54] SEMICONDUCTOR DEVICE AND PRODUCTION THEREOF

[75] Inventors: Hideo Miura, Koshigaya; Shunji Moribe, Koganei; Hisayuki Kato, Kokubunji; Atsuyoshi Koike, Kunitachi; Shuji Ikeda, Koganei; Asao Nishimura, Kokubunji, all of Japan

[73] Assignee: Hitachi, Ltd., Tokyo, Japan

[21] Appl. No.: 08/880,445

[22] Filed: Jun. 24, 1997

Related U.S. Application Data

[62] Division of application No. 08/527,942, Sep. 14, 1995, Pat. No. 5,670,793.

[30] Foreign Application Priority Data

Sep. 19, 1994 [JP] Japan .................................. 6-248310

[51] Int. Cl.$^7$ ................................................ H01L 21/8238
[52] U.S. Cl. ......................... 438/201; 438/585; 438/592; 438/593
[58] Field of Search ..................... 438/142, 186, 438/197, 201, 585, 591, FOR 177, 486, 592, 211

[56] References Cited

U.S. PATENT DOCUMENTS

| | | | |
|---|---|---|---|
| 5,111,266 | 5/1992 | Furumura et al. | 257/198 |
| 5,254,208 | 10/1993 | Zhang | 438/479 |
| 5,338,697 | 8/1994 | Aoki et al. | 438/291 |
| 5,438,019 | 8/1995 | Sandhu | 438/482 |
| 5,500,380 | 3/1996 | Kim | 438/158 |
| 5,563,093 | 10/1996 | Koda et al. | 438/231 |
| 5,753,555 | 5/1998 | Hada | 438/300 |
| 5,817,559 | 10/1998 | Mizuno et al. | 438/301 |

*Primary Examiner*—John F. Niebling
*Assistant Examiner*—Christopher Lattin
*Attorney, Agent, or Firm*—Antonelli, Terry, Stout & Kraus, LLP

[57] ABSTRACT

A semiconductor device containing a polycrystalline silicon thin film wherein crystal grains of the silicon thin film have mainly a columnar structure and a crystal orientation of individual crystal grains is almost in a uniform direction can be produced by depositing a non-impurity-doped silicon thin film or an impurity layer on an interface of underlying film, followed by deposition of impurity-doped silicon thin film, if necessary, followed by heat treatment for polycrystallization.

4 Claims, 11 Drawing Sheets

SEMICONDUCTOR DEVICE AND PRODUCTION THEREOF

This application is a Divisional application of application Ser. No. 08/527,942, filed Sep. 14, 1995 now U.S. Pat. No. 5,670,793.

BACKGROUND OF THE INVENTION

This invention relates to a semiconductor device prevented from changes of internal stress in a silicon thin film and generation of crystal defects caused by the changes of internal stress, and processes for producing the same, as well as to processes for producing a silicon thin film and a chemical vapor deposition apparatus suitable for forming such a silicon thin film.

In the production of semiconductor devices, a silicon thin film is used as electrodes and/or a wiring material. Since the silicon thin film is a semiconductor material, it is necessary to reduce electric resistance when used as a wiring material. In general, it is doped with an element of group III or V (e.g. B, P, As, etc.) by diffusion. In the doping with such an impurity, there has been employed thermal diffusion from film surface or ion implantation.

Recently, since the structure of semiconductor devices is complicated, a level difference of surfaces on which the thin film is to be deposited is made as small as possible in order to improve evenness of deposition of the thin film. Thus, there is a tendency to reduce the film thickness of various thin films including a silicon thin film. When the film thickness is reduced, there arise problems such as contamination of an underlying film with a dopant, concentration and uneven deposition of a dopant near the interface of underlying film, and the like, when the thermal diffusion from film surface or the ion implantation is employed. In order to solve such problems, an in-situ doping technique wherein an impurity is doped simultaneously at the time of deposition of a silicon thin film is proposed and used for producing products.

As processes for depositing a silicon thin film, there are known a process which comprises depositing silicon in an amorphous state, followed by polycrystallization by heat treatment, and a process for depositing in a polycrystalline state from the beginning. Generally speaking, since there is a tendency to enlarge crystal grain size in the case of deposition in an amorphous state, followed by polycrystallization by heat treatment, it is preferable to form a polycrystalline silicon film by this process in order to attain low electric resistance of the thin film. Therefore, there is widely used a process for forming a polycrystalline silicon film comprising depositing amorphous silicon doped with an impurity simultaneously, followed by polycrystallization by heat treatment. Such a technique is disclosed, for example, in Japanese Patent Unexamined Publication No. (JP-A) 62-54423 and 4-137724.

But, according to such a technique, there are following problems. When an amorphous (including a fine crystalline state) silicon thin film is crystallized by heat treatment, it is generally known that crystal nucleuses are grown from the interface between the silicon thin film and the underlying film. Therefore, the state of crystal growth is often changed (by, for example, generating density and generating temperature of crystal nucleuses, crystal grain size, or growing crystal plane indices) depending on an impurity concentration or its distribution in the amorphous silicon film near the interface of underlying film.

Further, at the time of crystallization reaction, since the volume of thin film is changed, the internal stress state in the film is also changed greatly. Further, the direction of stress (i.e. tensile strength or compression stress) generated at the time of crystallization is greatly changed by growing crystal state. As a result, there arise various problems in that generated internal stress in the silicon thin film becomes greater, or in a wafer on which the thin film is deposited, the internal stress in the thin film and growing crystal planes are differentiated, the degree of concentration of stress generated near end portions of the thin film and the crystal state are also differentiated, crystal defects such as dislocation are generated in a silicon single crystal substrate, electrical properties of a semiconductor device are differentiated in a wafer including a silicon single crystal, etc.

SUMMARY OF THE INVENTION

It is an object of the present invention to provide a semiconductor device improved in reliability overcoming the defects as mentioned above and processes for producing such a semiconductor device in a high yield.

It is another object of the present invention to provide processes for producing a polycrystalline silicon thin film on an optional substrate and a chemical vapor deposition apparatus for forming such a silicon thin film.

The present invention provides a semiconductor device comprising a semiconductor substrate, an underlying film formed thereon and a silicon thin film doped with an impurity selected from group III and V elements and formed on the underlying film, crystal grains of said silicon thin film having mainly a columnar structure grown from an interface of the underlying film to a surface of the silicon thin film, and a crystal orientation on film surfaces of individual crystal grains being in an almost uniform direction.

The present invention also provides a process for producing a semiconductor device, which comprises forming an underlying film on a semiconductor substrate, and forming a silicon thin film on the underlying film by depositing a silicon film having no impurity from a $SiH_4$ gas or a $Si_2H_6$ gas to a thickness of 1 nm or more, followed by deposition of the silicon film doped with an impurity selected from group III and V elements. When an amorphous silicon thin film is deposited, heat treatment is conducted to finally provide a polycrystalline silicon thin film.

The present invention further provides a process for producing a semiconductor device, which comprises forming an underlying film on a semiconductor substrate, forming an impurity layer from an impurity gas selected from group III and V elements, said impurity layer having a higher concentration of impurity than an average impurity concentration in a silicon thin film to be formed on an interface of underlying film, and depositing a silicon film from a $SiH_4$ gas or a $Si_2H_6$ gas doped with the impurity. When an amorphous silicon thin film is deposited, heat treatment is conducted to finally provide a polycrystalline silicon thin film.

The present invention still further provides a process for producing a silicon thin film, which comprises introducing into a reaction chamber a raw material gas selected from $SiH_4$ gas and $Si_2H_6$ gas to deposit a silicon film having no impurity to a thickness of 1 nm or more, followed by introduction of an impurity gas selected from group III and V elements together with the raw material gas to deposit a silicon film doped with the impurity. When an amorphous silicon thin film is deposited, heat treatment is conducted to finally provide a polycrystalline silicon thin film.

The present invention also provides a process for producing a silicon thin film, which comprises introducing into a reaction chamber an impurity gas selected from group III and V elements to form an impurity layer having a higher concentration than an average impurity concentration in a silicon thin film to be formed on an interface of underlying film, and introducing a raw material gas selected from $SiH_4$ gas and $Si_2H_6$ gas together with the impurity gas to deposit a silicon thin film doped with the impurity. When an amorphous silicon thin film is deposited, heat treatment is conducted to finally provide a polycrystalline silicon thin film.

The present invention further provide a chemical vapor deposition apparatus for forming a silicon thin film comprising a reaction chamber, a gas introducing unit for introducing a raw material gas and an impurity gas into the reaction chamber, a unit for controlling film deposition in the reaction chamber, and a gas exhaust unit for exhausting gases from the reaction chamber, said unit for controlling film deposition being made either
(i) so as to introduce the impurity gas selected from group III and V elements together with the raw material gas after the introduction of only the raw material gas selected from $SiH_4$ gas and $Si_2H_6$ gas for a predetermined time, or
(ii) so as to introduce only the impurity gas selected from group III and IV elements for a predetermined time before the introduction of the raw material gas selected from $SiH_4$ gas and $Si_2H_6$ gas together with the impurity gas.

DESCRIPTION OF THE PREFERRED EMBODIMENTS

Figure 1:
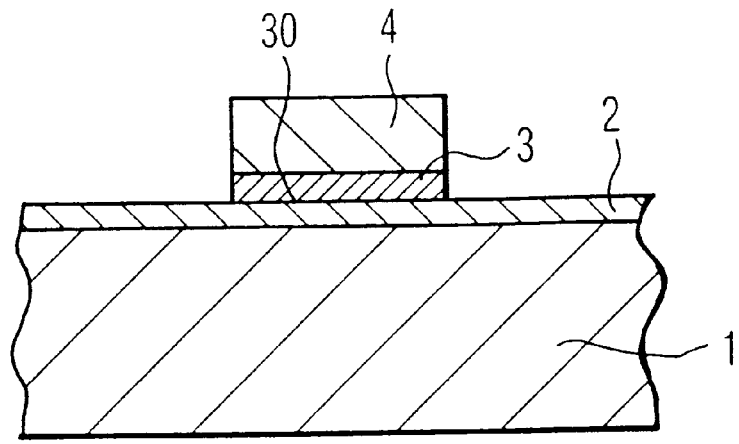
FIG. 1 is a cross-sectional view of one example of the semiconductor device immediately after the film deposition according to the present invention.

In order to solve the problems of the prior art, the present inventors found that the impurity concentration and its distribution (or differences in the concentration) near the interface between the amorphous (including fine crystalline state) silicon thin film and the underlying film (e.g. silicon dioxide film) is controlled so as to make the state for generating crystal nucleuses almost uniform and to make the crystal state (crystal grain size and crystal orientation) of polycrystalline film after heat treatment stable (or uniform).

Further, in order to control the impurity concentration and its distribution near the interface of underlying film, the present inventors found that it is effective to form either a layer not containing an impurity near the interface of underlying film (i.e. on the underlying film), or a layer containing the impurity in a remarkably high concentration near the interface of underlying film (i.e. on the underlying film). By employing such a method, the direction of crystal plane of polycrystalline layer after crystallization becomes almost uniform, so that the above-mentioned object can be attained due to stabilization of crystal state.

The semiconductor device according to the present invention comprises a semiconductor substrate, an underlying film formed thereon and a polycrystalline silicon thin film doped with an impurity selected from group III and V elements and formed on the underlying film, crystal grains of said silicon thin film having mainly a columnar structure grown from an interface of the underlying film to a surface of the silicon thin film, and a crystal orientation on film surfaces of individual crystal grains being in an almost uniform direction.

As the semiconductor substrate, there can be used conventional ones such as a silicon single crystal substrate, a so-called SOI (silicon-on-insulator) substrate, a wafer obtained by epitaxial growth, and the like. As the underlying film, there can be used films of $SiO_2$, SiN, $N_2O$ (oxynitride), $Ta_2O_5$, ferroelectric metals of PZT (complex of oxides of Pb, Zr and Ti), or a laminate structure thereof. As the impurity, there can be used an element selected from group III and V elements such as P (phosphorus), B (boron), As (arsenic), etc. singly or as a mixture thereof. Further, the expression "in an almost uniform direction" means that crystal graphic direction of polycrystalline grains is the same in 60% or more, preferably 80% or more, more preferably 90% or more.

In the case of providing a metal-oxide-silicon (MOS) field-effect transistor, a gate oxide film is used as the underlying film and a gate electrode is made from a polycrystalline silicon thin film. That is, the semiconductor device comprises a silicon single crystal substrate, a gate oxide film and a gate electrode formed on the gate oxide film, said gate electrode being made from a silicon thin film doped with an impurity selected from group III and V elements, said silicon thin film being deposited on the gate oxide film, crystal gains of said silicon thin film having mainly a columnar structure grown from an interface of the gate oxide film to a surface of the silicon thin film, and a crystal orientation of film surfaces of individual crystal grains being in an almost uniform direction.

Such a semiconductor device can be produced by forming an underlying film on a semiconductor substrate using a conventional method, and forming a silicon thin film on the underlying film by depositing a silicon film having no impurity from a raw material gas such as a $SiH_4$ gas or a $Si_2H_6$ gas to a thickness of 1 nm or more, followed by deposition of the silicon film doped with an impurity selected from group III and V elements, followed by heat treatment at 550° C. to 1000° C. when the deposited silicon film is an amorphous silicon film to give a polycrystalline silicon thin film.

Alternatively, such a semiconductor device can be produced by forming an underlying film on a semiconductor substrate using a conventional method, and forming a silicon thin film on the underlying film by forming an impurity layer from an impurity gas selected from group III and V elements, said impurity layer having a higher concentration of impurity than an average impurity concentration in a silicon thin film to be formed on an interface of underlying film and depositing a silicon film from a raw material gas such as a $SiH_4$ gas or a $Si_2H_6$ gas doped with the impurity, followed by heat treatment at 550° C. to 1000° C. when the deposited silicon film is an amorphous silicon film to give a polycrystalline silicon thin film.

The deposition of silicon thin film is carried out at 500° C. to 700° C. in the case of polycrystalline silicon thin film, or at 500° C. to 600° C. in the case of amorphous silicon thin film.

The average concentration of impurity in the thin film is about $10^{18}$–$10^{21}$ number of atom per $cm^3$, and the silicon concentration in the thin film is about $5 \times 10^{22}$ number of atom per $cm^3$.

As mentioned above, (i) by depositing a silicon thin film containing no impurity first to a thickness for making the crystal growth mood uniform, followed by deposition of a silicon thin film doped with an impurity, or (ii) by depositing an impurity layer having a higher concentration of impurity than an average impurity concentration in a silicon thin film to be formed on an interface of underlying film, followed by deposition of a silicon thin film doped with the impurity, the semiconductor device having improved reliability can be produced in a high yield overcoming the prior art problems.

Observation of crystal structure in the course of crystallization at a cross-section of the film is explained below referring to polycrystallization of amorphous silicon thin film by heat treatment. The amorphous silicon thin film is formed, for example, on a thermal oxide film of silicon (as an underlying film) in about 100 nm thick. A part of amorphous state is found to be crystallized.

It is admitted in the polycrystallized film that individual crystal grains begin to grow near the interface of underlying film and grow columnarly to the surface of the thin film. In other words, the crystal nucleuses of individual crystal grains are generated near the interface between the thin film and the underlying film. But it should be noted that there are two kinds of plane shapes of crystal grains, when observed from the surface direction of the thin film. That is, there are crystal grains grown in the shape of "asteroid" and crystal grains grown in the shape of "ellipsoid" in admixture.

The crystal grains grown in the shape of ellipsoid are silicon single crystals and the (311) plane of silicon crystal is grown to the top surface of the thin film. This is confirmed by an electron diffraction method. On the other hand, the crystal grains grown in the shape of asteroid are polycrystalline silicon and each hand portion of the asteroid shows a sing crystal state having the (111) crystal plane. This is also confirmed by the electron diffraction method.

Further, analysis reveals that in the asteroid crystal grains, each hand is grown from central portion of the asteroid and the impurity such as P concentration near the central portion is higher than the average P concentration of the thin film by 30% to 50%. These results suggest that the nucleuses of these crystal gains seem to be formed by unevenly distributed high P concentration. Another proof is that the crystal grain density of the asteroid crystals do not change almost from the beginning of crystal growth.

In the course of growth of crystal grains, asteroid crystal grains grow first, followed by growth of elliptic crystal grains. But, the elliptic crystal grain density seems to increase simply with the lapse of time. From this point of view, the form of crystal growth is greatly different between the asteroid crystal grains and the elliptic crystal grains. Since crystal anisotropy exists in physical properties of silicon crystals, when crystal grains having different orientations of crystal planes are present in admixture, physical properties become different locally in the thin film.

The presence of such thin film in the semiconductor device is not preferable. It is desirable that the crystal orientation is almost in a uniform direction. Further, internal stress state in the thin film changes depending on orientation of crystal plane. The internal stress value is the highest when the (111) crystal plane grows and decreases with an increase of the crystal plane indices (the direction from the (111) plane to the (211) plane and (311) plane). Measured value of internal stress is 1200 MPa when the crystal plane index is at the (111) plane, 1000 MPa at the (211) plane, and 800 MPa at the (311) plane. This is because in the silicon crystals since the (111) crystal plane has the highest atomic density at the highest denseness plane, the shrinkage of the thin film becomes larger relatively compared with the case of growing other crystal plane.

When the thin film as a single body shrinks freely, no stress is generated. But in practice, since the silicon thin film adheres to (or sticks to) the underlying film, the thin film is restrained from free shrinkage, resulting in generating stress in the thin film. The value of stress generated seems to be higher with larger shrinkage of the thin film. Therefore, when the (111) crystal plane grows, the internal stress in the thin film seems to become the highest.

The above-mentioned internal stress value in the thin film is in the case when a simple crystal plane grows. When crystal grains growing in different crystal plane directions are present in admixture, an intermediate value will be taken depending on occupying rates of crystal plane directions of individual crystal grains. In this case, it is very difficult to control the internal stress of the thin film. Further, even when the (111) crystal plane which is to take a high internal stress value grows, it is possible to prevent the generation of failure caused by the internal stress of whole of the semiconductor device by changing a semiconductor device structure or a combination of materials used. Thus, if the stress value to be generated is known, it is possible to avoid the case of impossible to use. The important thing is to establish the homogenuity of the thin film (including variation of stress value) by avoiding the admixed state of crystal grains having different grown crystal planes.

When the thin film is deposited by positively controlling the impurity (e.g. phosphorus P) concentration near the interface of underlying film, the crystals grow as follows. In the case of forming a P-doped silicon thin film, the crystal growth of the silicon thin film can be controlled by positively controlling the P concentration near the interface of underlying layer.

By applying this thin film deposition method, it is possible to grow a special crystal plane. Thus, it is possible to obtain polycrystalline silicon film having an almost uniform crystal state (i.e. polycrystalline silicon thin film having no dispersion or variation of internal stress) with sufficiently low electrical resistance by forming an amorphous silicon thin film by this depositing method, followed by crystallization by heat treatment.

As mentioned above, it is important to control the crystal growth of the thin film in order to obtain the polycrystalline film having highly homogeneous and almost uniformly grown crystal planes. Further, even in the case of growing the polycrystalline layer from the beginning of the deposition of thin film, it is important to control the P concentration from the beginning of the deposition of thin film from the viewpoint of control of crystal growth. Thus, this thin film deposition method is very important from the viewpoint of controlling crystal planes of polycrystalline thin film.

According to the present invention, the semiconductor device using a silicon thin film doped with an impurity of group III or V elements is characterized in that the semiconductor device is produced by controlling the impurity concentration near the interface between the underlying film and the silicon thin film to remarkably low (preferably zero or almost zero) compared with the average impurity concentration in the thin film, or sufficiently high; and as a result, the crystal plane direction in the polycrystalline silicon thin film after crystallization is in an almost uniform direction.

The above-mentioned steps for forming a silicon thin film can also be applied to processes for producing a silicon thin film on an optional substrate.

The chemical vapor deposition apparatus suitable for producing such a silicon thin film according to the present invention comprises a reaction chamber installing therein a support board for placing a substrate such as a wafer, a gas introducing unit for introducing a raw material gas (e.g. $SiH_4$ or $Si_2H_6$ gas) and an impurity gas (selected from group III and V elements) into the reaction chamber, a unit for controlling film deposition in the reaction chamber, and a gas exhaust unit for exhausting gases from the reaction chamber, said unit for controlling film deposition being made either
(i) so as to introduce the impurity gas together with the raw material gas after the introduction of only the raw material gas for a predetermined time, or
(ii) so as to introduce only the impurity gas for a predetermined time before the introduction of the raw material gas together with the impurity gas.

The present invention is illustrated by way of the following Examples.

EXAMPLE 1

This Example shows the case of not introducing an impurity near the interface of underlying film as a method of controlling the impurity concentration and distribution thereof near the interface of underlying film.

Figure 2:
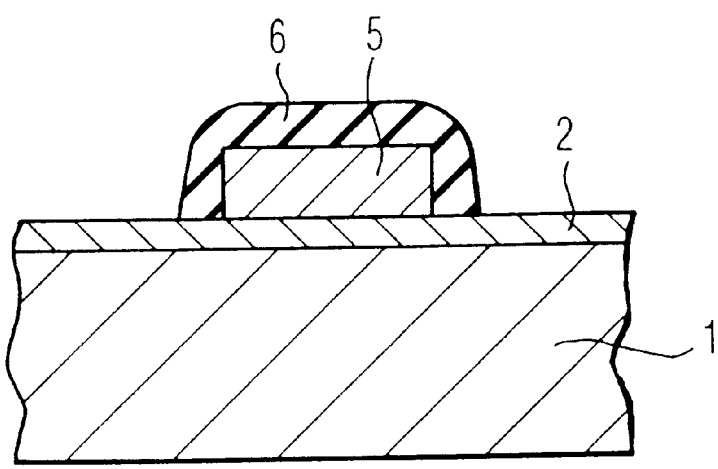
FIG. 2 is a cross-sectional view of the same example of the semiconductor device after heat treatment according to the present invention.
Figure 3:
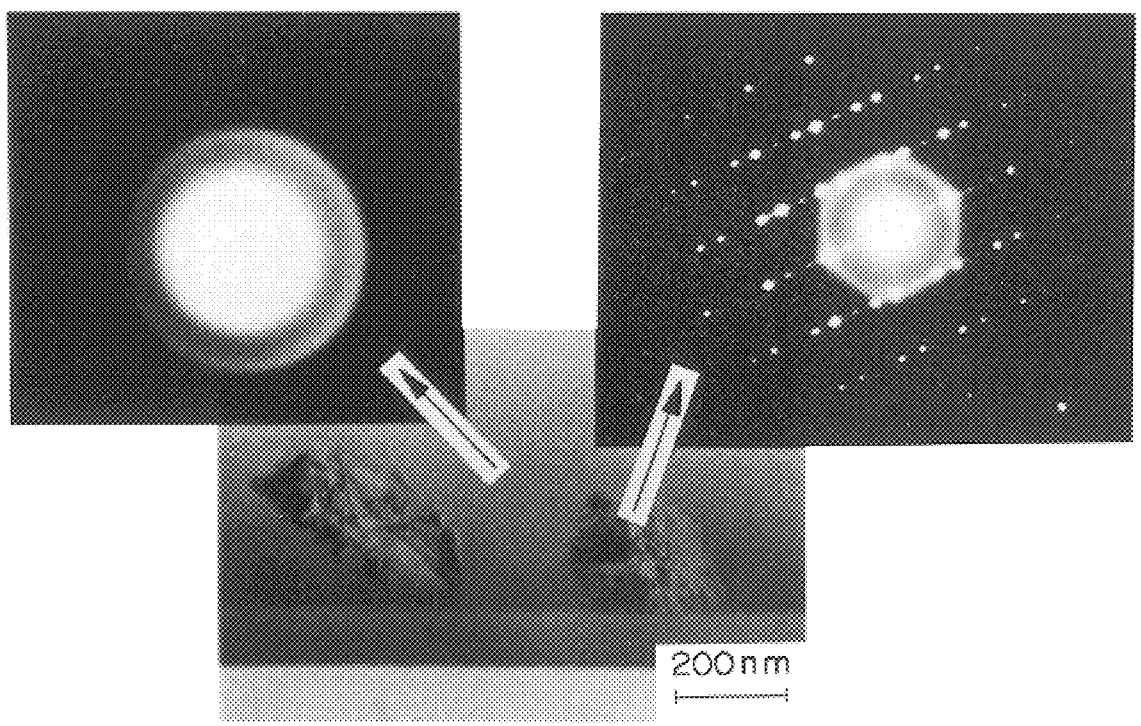
FIG. 3 is an electron microscope photograph showing the structure of growing crystal at a cross-section of P-doped amorphous silicon thin film.
Figure 4:
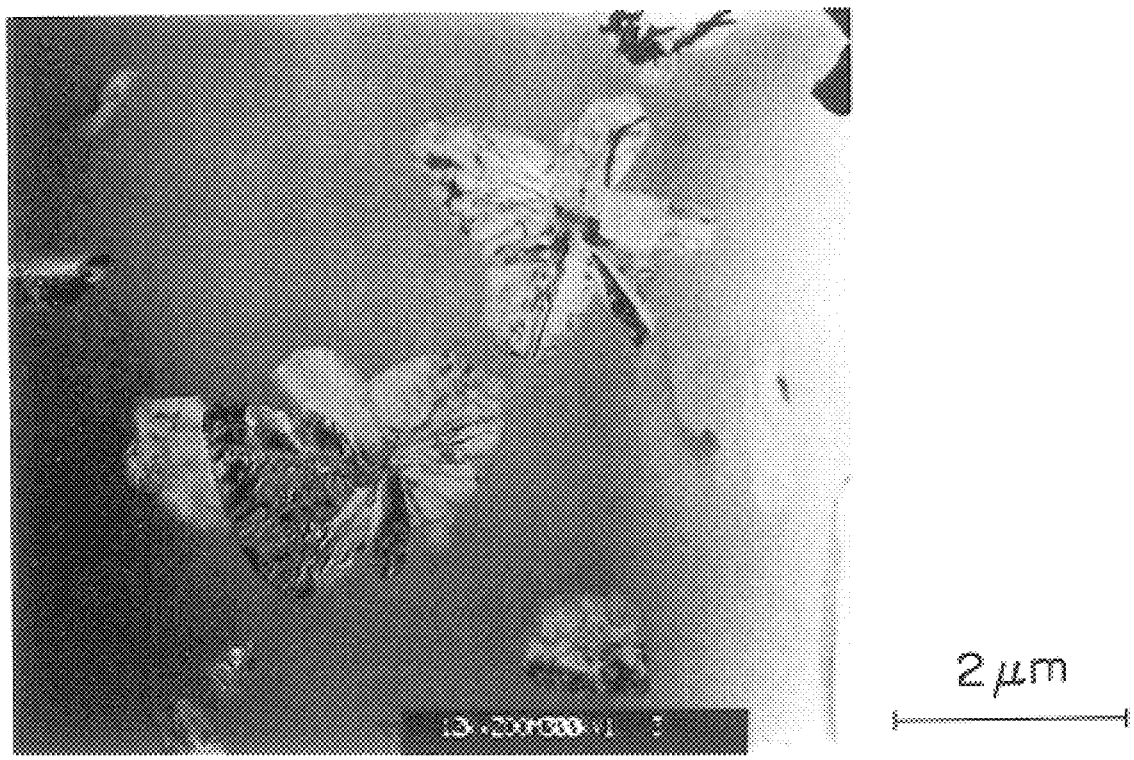
FIG. 4 is an electron microscope photograph showing the structure of growing crystal at a plane of P-doped amorphous silicon thin film.
Figure 5:
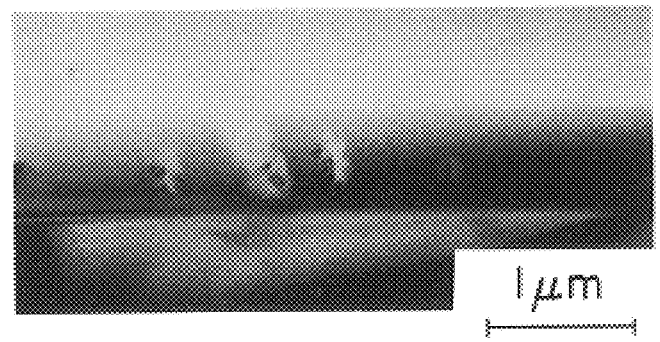
FIG. 5 is an electron microscope photograph showing the structure of growing crystal at a cross-section of P-doped amorphous silicon thin film when the non-doped layer is formed.
Figure 6:
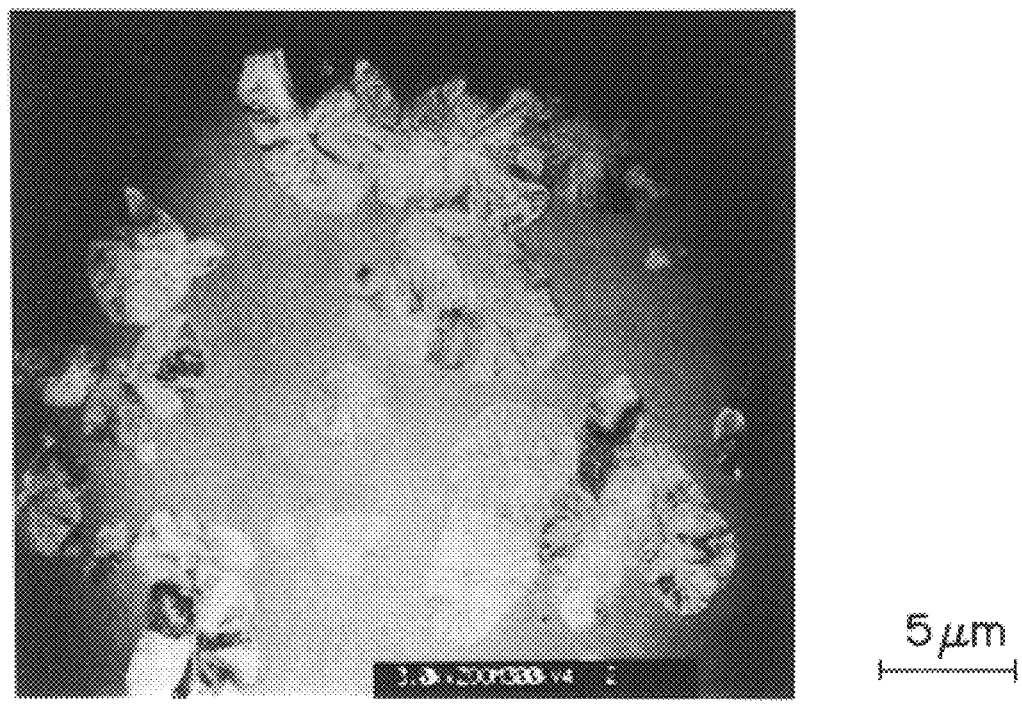
FIG. 6 is an electron microscope photograph showing the structure of growing crystal at a plate of P-doped amorphous silicon thin film when the non-doped layer is formed.
Figure 7:
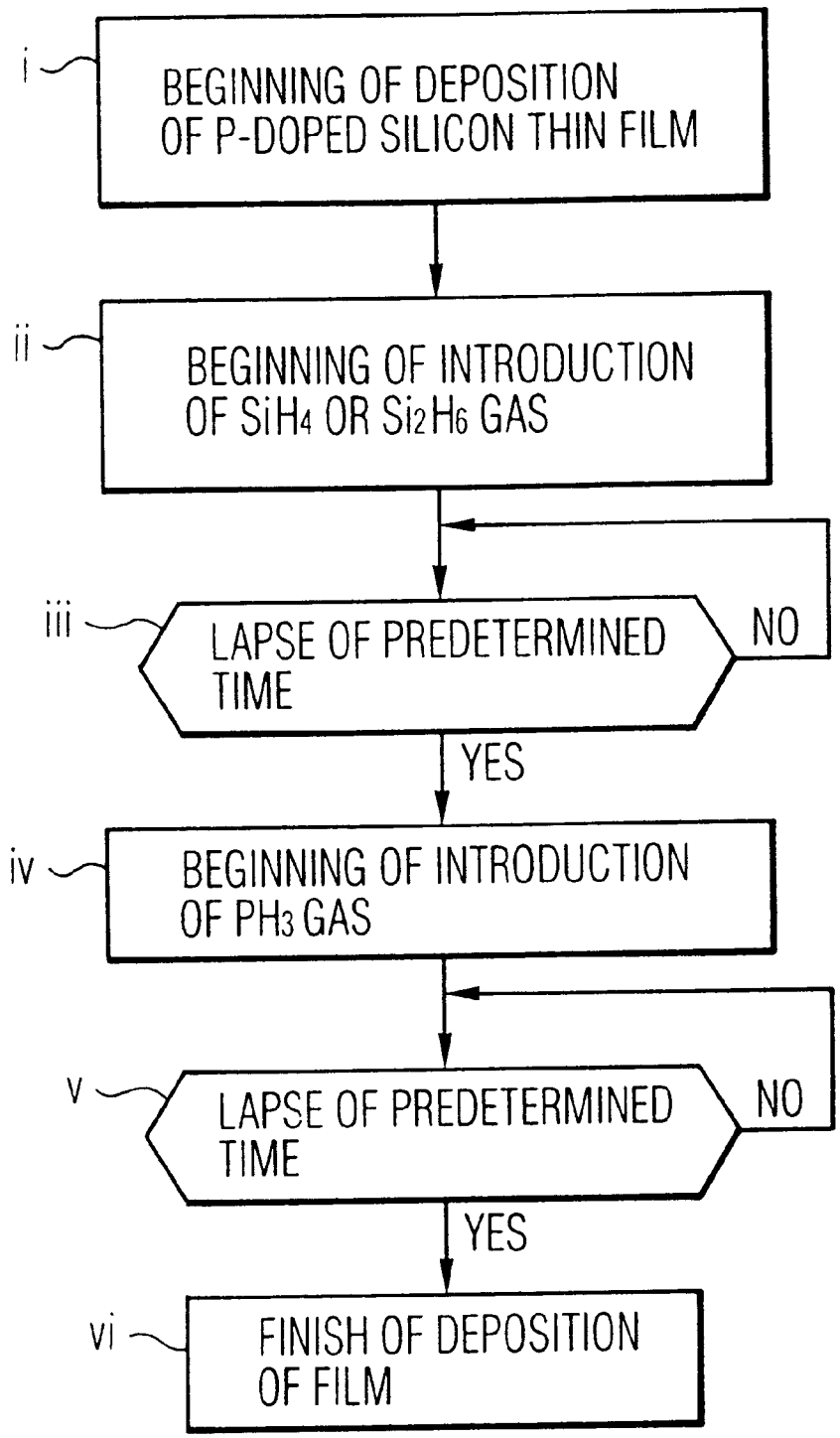
FIG. 7 is a flow chart explaining one example of the process for depositing the thin film.

This Example is explained referring to FIGS. 1 to 7. This Example is suitable for producing a gate electrode of MOS (metal-oxide-semiconductor) transistor. FIG. 1 is a cross-sectional view immediately after the deposition of thin film (after patterning). FIG. 2 is a cross-sectional view after formation of a polycrystalline film and formation of an insulating film 6. In FIGS. 1 and 2, numeral 1 denotes a silicon substrate, numeral 2 denotes a silicon oxide film, numeral 3 denotes a non-doped amorphous silicon layer, numeral 4 denotes a P-doped amorphous silicon layer, numeral 5 denotes a P-doped polycrystalline silicon film, and numeral 30 denotes an interface of underlying film. FIGS. 3 to 6 are transmission electron microscope photographs showing crystal growth when an amorphous silicon thin film in about 500 nm thick is doped with an impurity such as P (phosphorus) in an average concentration of c.a. $4 \times 10^{20}/cm^3$ at near the interface of the underlying film, followed by heat treatment for polycrystallization. FIGS. 3 and 5 are cross-sectional views of the thin film, and FIGS. 4 and 6 are surface views of the thin film. Further, FIGS. 5 and 6 show the case of forming a non-doped layer. FIG. 7 is a flow chart showing a process for producing a gate electrode film.

The process for depositing a P-doped silicon thin film on a silicon substrate 1 on which a silicon oxide film 2 is formed is explained referring to FIG. 7. In the step (i), deposition of a P-doped silicon thin film begins. First, only a raw material gas (e.g. $SiH_4$ gas or $Si_2H_6$ gas) is introduced for a predetermined time to deposit an amorphous silicon film (ii). By this, the non-doped layer 3 not doped with P shown in FIG. 1 is formed (iii). After the lapse of the predetermined time, a P doping gas (e.g. $PH_3$ gas) is introduced (iv). Then, the deposition of P-doped amorphous silicon film 4 is continued to a predetermined thickness (v). In this case, the total thickness and average P concentration of the thin film are made equal to the case of not positively controlling the P concentration near the interface of underlying film. By this, the amorphous silicon thin film shown in FIG. 1 is formed (vi). After heat treatment, P-doped polycrystalline silicon film 5 is formed by crystallization.

The thus polycrystallized film is obtained by initially growing individual crystal grains from near the interface of underlying film and further growing columnar structure to the thin film surface. This can be confirmed by FIGS. 3 and 5 observed from the cross-sectional direction. In other words, the crystal nucleuses of individual crystal grains are generated near the interface of underlying film. But it should be noted that when observed from the surface direction of the thin film, the plane shape of crystal grains is divided into two kinds as shown in FIG. 4 when the non-doped layer is not formed. That is, there are crystal grains grown in the asteroid shape and crystal grains grown in the elliptic shape in admixture. In contrast, when the non-doped layer is formed as shown in FIG. 6, crystal grains having the asteroid shape are not admitted and only crystal grains having the elliptic shape are admitted. The elliptic crystals have the (311) crystal plane grown to the thin film surface. This is confirmed by the measured results by electron diffractometry.

From these measured results, it becomes clear that it is possible to form a thin film wherein only the (311) crystal plane is grown by forming the non-doped layer which is not doped with P positively at near the interface of the underlying film.

On the other hand, in order to reduce the electric resistivity of the whole thin film, it is impossible to thicken the thickness of the layer not introducing the impurity without limitation. Therefore, the thickness of the layer not doped with the impurity is as small as possible so as to make the crystal growth mode uniform and the amount of impurity for doping in the upper layer of the thin film is a sufficient amount for controlling the electric resistance as a whole to a predetermined value.

It is clear from the experimental data that when the thickness of the non-doped layer is less than 1 nm, the effect mentioned above is reduced. This is because since P-doping begins after the formation of the non-doped layer, P seems to diffuse into the non-doped layer during the deposition of the P-doped film, when the thickness of non-doped layer is less than 1 nm. Therefore, the growth of the special crystal plane is not dominated so as to make it difficult to control the internal stress as in the case of known production processes. When the thickness is 1 nm or more, even if P diffuses during the P-doped thin film deposition, the effect is not reached to the non-doped layer near the interface of underlying film, resulting in not influencing the crystal growth. Further, it is confirmed by experiments that the thickness of 10 nm or less is sufficient to show the above-mentioned effect. When the thickness is more than 10 nm, the proportion of growth of the special crystal plane is not changed, but the electric resistance of the silicon thin film increases undesirably. Therefore, in order to reduce the electric resistance of the silicon thin film, the thickness of the layer not containing the impurity is preferably 1 to 10 nm. Thus, the predetermined time for depositing the amorphous film means a time necessary for depositing the film having the film thickness in the above-mentioned range.

On the other hand, even in the case of growing polycrystalline layer from the beginning of the film deposition, the crystal growth can be controlled by controlling the P concentration at the beginning of the film deposition. For example, when a polycrystalline layer is formed on a silicon oxide film using a $SiH_4$ gas, the (311) crystal plane grows predominantly by making a time lag of introduction of P, while the (211) crystal plane grows predominantly when P is introduced positively.

The thin film having the above-mentioned structure can be formed without divided two steps. In the case of forming the silicon thin film doped with an impurity by in-situ doping, the flow of a dopant gas can be started after a predetermined time from the beginning of flow of a raw material gas for forming the silicon thin film. By this, it is possible to form a silicon thin layer containing no impurity and a silicon thin layer doped with the impurity continuously.

The impurity used as a dopant is not limited to P, and B (boron) or As (arsenic) can also be used. Therefore, the dopant gas, the doped amorphous silicon film and the polycrystalline silicon thin film can include B or As in place of P. This can also be applied to the Examples mentioned below.

In this Example, the crystallization is conducted after patterning of amorphous silicon film (after the state shown by FIG. 1), but not limited thereto and possible before the patterning. Further, as the impurity, B or As can be used as a dopant in place of P. This can also be applied to the Examples mentioned below.

Further, the process of this Example is not limited to the production of the gate electrode of the MOS transistor structure, and can be applied to the production of an emitter electrode, a base electrode and a collector electrode of bipolar transistors, or a gate electrode, a floating electrode, and a control electrode of flash memory structure.

EXAMPLE 2

This Example shows the case of controlling the impurity concentration near the interface of underlying film to a sufficiently high value.

Figure 8:
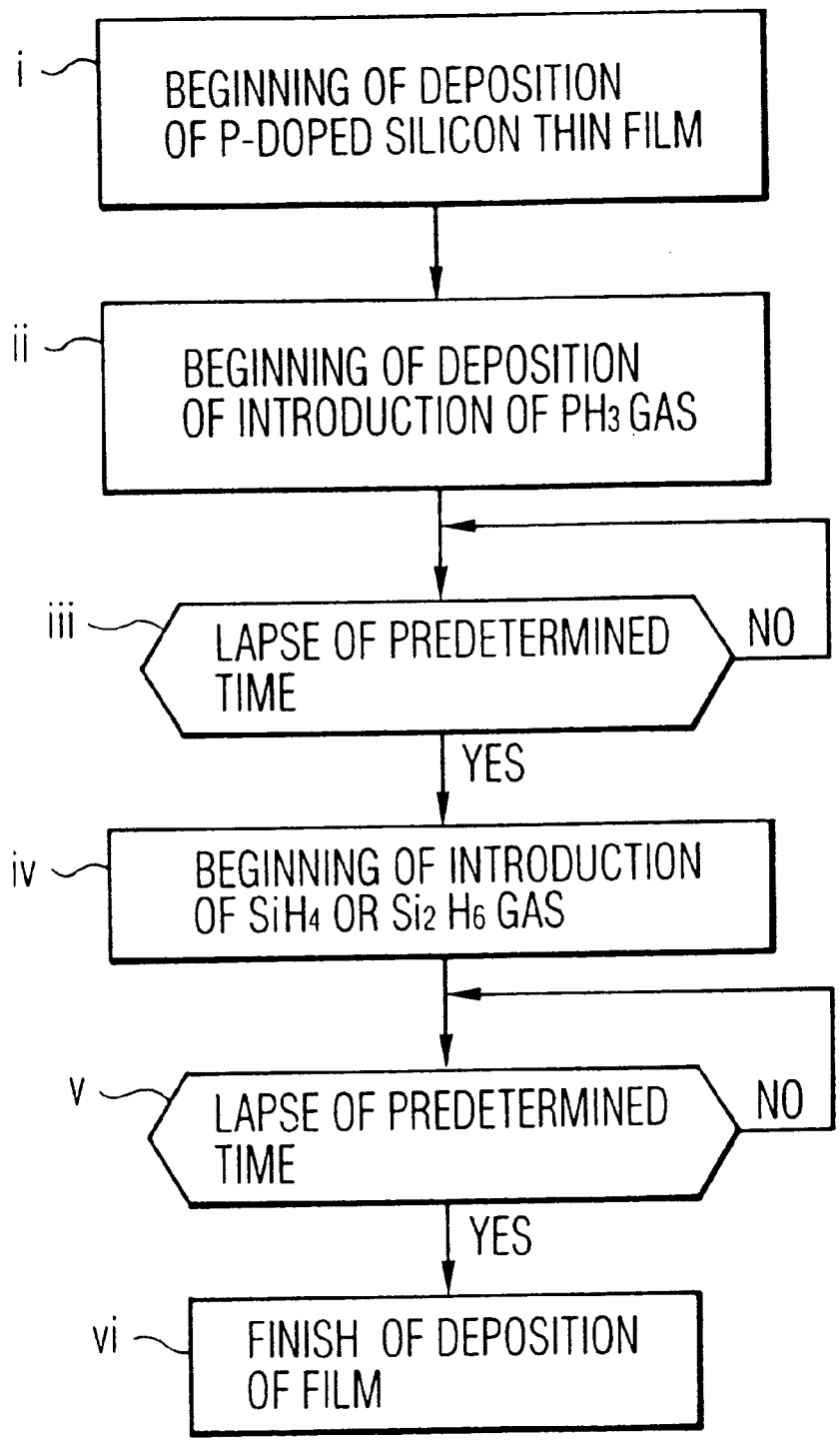
FIG. 8 is a flow chart explaining another example of the process for depositing the thin film.
Figure 9:
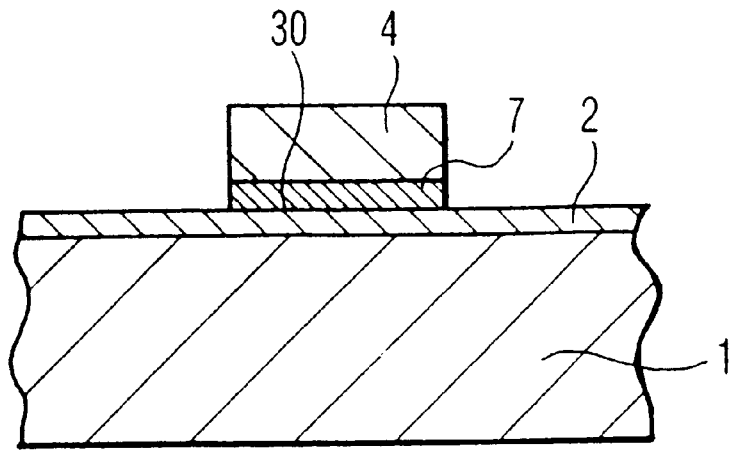
FIG. 9 is a cross-sectional view of another example of the semiconductor device immediately after the film deposition according to the present invention.
Figure 10:
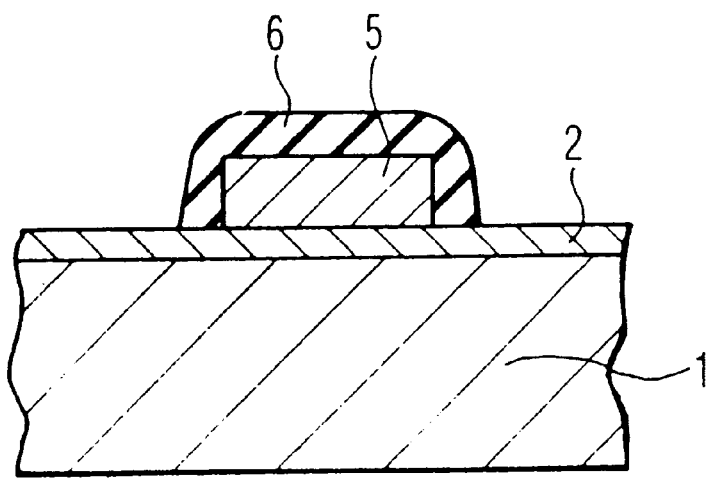
FIG. 10 is a cross-sectional view of the same example of the semiconductor device after heat treatment according to the present invention.

This Example is explained referring to FIGS. 8 to 10. This Example also shows the production of gate electrode in the MOS transistor as in Example 1. FIG. 8 is a flow chart explaining the deposition steps. FIG. 9 is a cross-sectional view immediately after the film deposition (after the film deposition and patterning), wherein numeral 7 denotes a P-high concentration layer, and FIG. 10 is a cross-sectional view after formation of polycrystalline film and then an insulating film 6.

In order to control the impurity concentration near the interface between the underlying film and the silicon thin film at a sufficiently high value, it is preferable to introduce only the impurity gas for a predetermined time before introduction of a raw material gas such as $SiH_4$ gas or $Si_2H_6$ gas for depositing the silicon thin film in order to form an impurity layer near the interface of underlying film, followed by deposition of silicon thin film doped with the impurity.

This Example is explained referring to the flow chart of FIG. 8. In this Example, on a silicon substrate 1, on which a silicon oxide film 2 is formed, a P-doped amorphous silicon film 4 is deposited (i). First, only P-dopant gas is introduced immediately after the beginning (ii). By introducing P-dopant for a predetermined time, a P-high concentration layer 7 is formed (iii). Then, a raw material gas (e.g. $SiH_4$ gas or $Si_2H_6$ gas) for depositing the silicon thin film is introduced (iv). The deposition of P-doped amorphous silicon film 4 is continued to obtain the predetermined thickness (v). In this case, the thickness of the whole thin film and the average P concentration therein are made equal to the case of not positively controlling the P concentration near the interface of the underlying film. By this, the amorphous silicon thin film having the structure shown in FIG. 9 is formed (vi). After crystallization by heat treatment, the P-doped polycrystalline silicon film 5 is formed.

By employing this deposition method, a P-doped amorphous silicon film 4 is formed after the formation of P-high concentration layer 7 wherein the impurity is unevenly present near the interface of the underlying silicon oxide film 2. By subjecting the resulting thin film to heat treatment, there is formed a polycrystalline layer wherein the unevenly deposited high concentration P becomes crystal nucleuses to proceed crystal growth and the asteroid shaped crystal grains predominantly grow in substantially 90% or more, so that the crystal grains grow in the direction of the (111) crystal plane. As a result, the polycrystalline film after the crystallization reaction has a uniform crystal plane direction of the (111) crystal plane. Thus, the internal stress is reduced to a stable predetermined value.

The process of this Example is not limited to the production of the gate electrode of the MOS transistor structure, and can be applied to the production of an emitter electrode, a base electrode and a collector electrode of bipolar transistors, or a gate electrode, a floating electrode, and a control electrode of flash memory structure.

EXAMPLE 3

Figure 11:
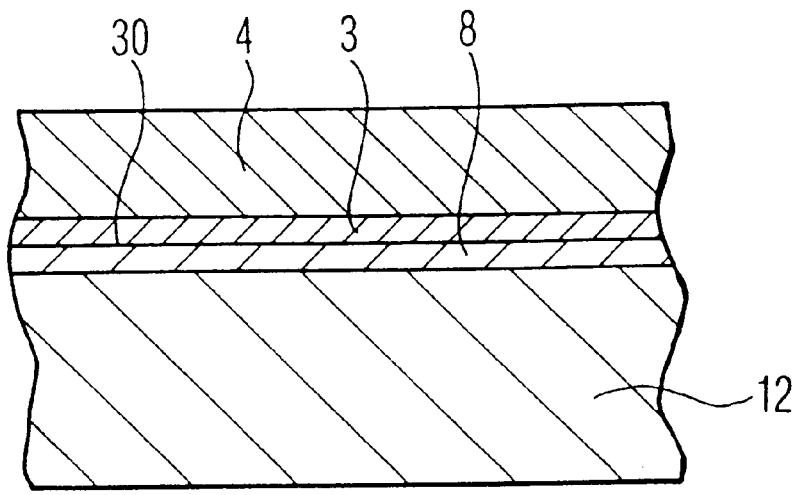
FIG. 11 is a cross-sectional view of a further example of the semiconductor device immediately after the film deposition according to the present invention.
Figure 12:
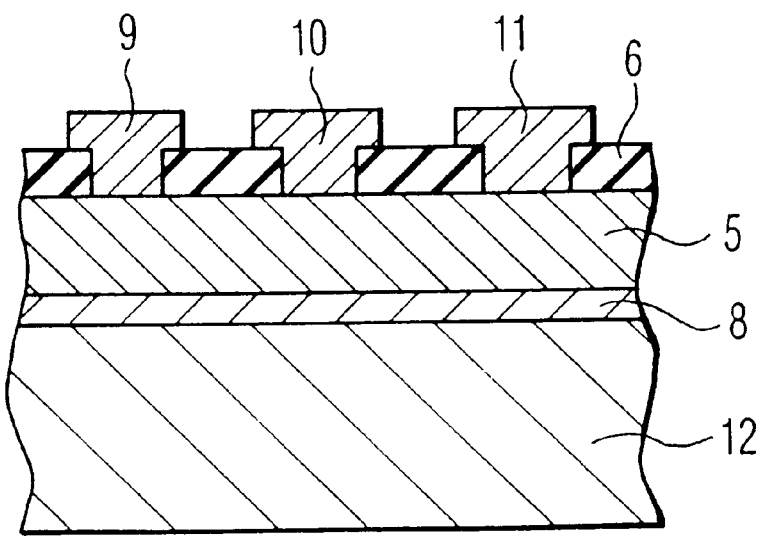
FIG. 12 is a cross-sectional view of a transistor according to the present invention.

This Example is explained referring to FIGS. 7, 11 and 12. In this Example, the present invention is applied to the formation of polycrystalline silicon thin film forming a semiconductor device such as transistors and diodes.

FIG. 7 is a flow chart showing the steps for forming the polycrystalline silicon thin film. FIG. 11 is a cross-sectional view showing the state immediately after the deposition of the thin film, and FIG. 12 is a cross-sectional view of the transistor formed in the polycrystalline silicon thin film, wherein numeral 8 denotes an underlying film, numeral 9 denotes an emitter electrode, numeral 10 denotes a base electrode, numeral 11 is a collector electrode, and numeral 12 is a substrate. In this Example, the step of introduction of impurity for forming the transistor is omitted, since it has no direct relation to the essence of this Example.

In this Example, on a silicon substrate 1, an underlying film 8 made from a different material (e.g. SiN) from silicon is formed. On this, a P-doped silicon thin film is formed (i). First, only the raw material gas (e.g. $SiH_4$ gas or $Si_2H_6$ gas) is introduced (ii). After a predetermined time, a non-doped amorphous silicon layer 3 having the predetermined thickness is formed (iii). Then, an impurity of P as a dopant gas is introduced (iv). The deposition of P-doped amorphous silicon film 4 is continued to obtain the predetermined thickness (v). The thickness of the whole thin film and the average P concentration therein are made equal to the case of not positively controlling the P concentration near the interface of underlying film. FIG. 11 is a cross-sectional view of the thus produced thin film (vi).

In this Example, since the (311) crystal plane begins to grow already in the initial non-doped layer, the growth of (311) crystal plane in the P-doped layer is continued to finally obtain a polycrystalline film having an orientation in the (311) crystal plane direction uniformly. Further, when P is positively introduced as in Example 1, the (211) crystal plane predominantly grows. After crystallization reaction by heat treatment, the P-doped polycrystalline silicon film 5 is formed. Thereafter, a transistor is formed to give a semiconductor device having the cross-sectional structure as shown in FIG. 12.

In this Example, since a bipolar transistor is formed, the base electrode 10, the emitter electrode 9, the collector electrode 11, etc. are formed. These electrodes are not always be required to be formed nearby, and the order of the positions of them can be optional. Further, the transistor formed in the polycrystalline silicon thin film is not always limited to the bipolar transistor, and it can be a diode, or other type of transistor, and the like semiconductor device.

In this Example, since the non-doped layer is present near the interface of underlying film under the P-doped amorphous silicon thin film, there can be obtained a polycrystalline layer having the orientation predominantly (90% or more) in the direction of the (311) crystal plane or (211) crystal plane. Further, since the P-doped silicon thin film stable in internal stress can be obtained, properties of the semiconductor device (e.g. transistor) formed in individual crystal grains are low in variation, and thus remarkably stabilized.

EXAMPLE 4

Figure 13:
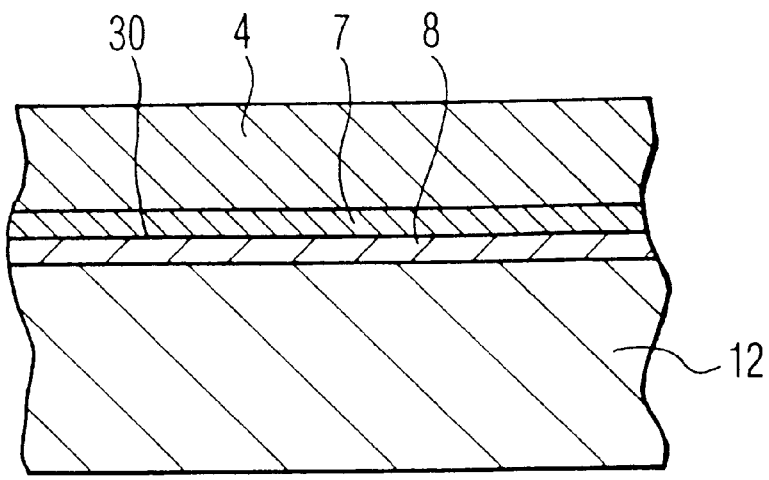
FIG. 13 is a cross-sectional view of a still further example of the semiconductor device immediately after the film deposition according to the present invention.
Figure 14:
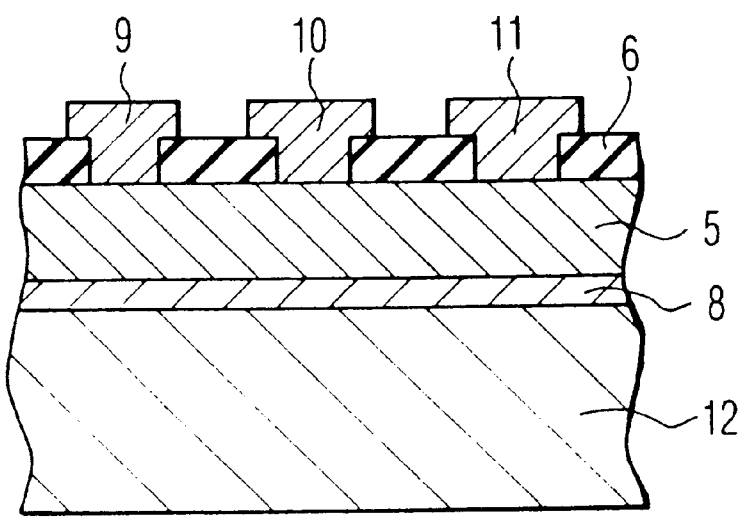
FIG. 14 is a cross-sectional view of one example of the semiconductor device according to the present invention.

This Example is explained referring to FIGS. 8, 13 an 14. This Example is suitable for the production of polycrystalline silicon thin film in which a semiconductor device such as a transistor or diode is formed. FIG. 13 is a cross-sectional view immediately after the deposition of the thin film. FIG. 14 is a cross-sectional view of the transistor formed in the polycrystalline silicon thin film. In this Example, the step of introduction of impurity for forming the transistor is omitted, since it has no direct relation to the essence of this Example.

This Example is explained referring to the flow chart of FIG. 8. In this Example, on the silicon substrate 12, an underlying film 8 made from a different material (e.g. SiN) from silicon is formed, and a P-doped silicon thin film 4 is formed thereon (i). First, only a P dopant is introduced immediately after the beginning (ii). After a predetermined time, a P-high concentration layer 7 is formed (iii). Then, a raw material gas (e.g. $SiH_4$ gas or $Si_2H_6$ gas) is introduced for depositing a silicon thin film (iv). The deposition of P-doped amorphous silicon film 4 is continued to obtain a predetermined thickness (v). In this case, the thickness of whole thin film and the average P concentration therein are made equal to the case of not positively controlling the P concentration near the interface of underlying film. By this, the amorphous silicon thin film having the structure as shown in FIG. 13 is formed (vi).

By subjecting the resulting thin film to heat treatment, there is formed the P-doped polycrystalline silicon film 5, wherein the crystal grains grow in the direction of the (111) crystal plane by conducting the crystal growth using the unevenly deposited P in high concentration as crystal nucleuses. Thus the polycrystalline thin film after the crystallization reaction is a uniform and homogeneous film having the orientation in the (111) crystal plane direction. Further, since the P-doped silicon thin film stable in internal stress can be obtained, properties of the semiconductor device (e.g. transistor) formed in individual crystal grains are low in variation, and thus remarkably stabilized.

FIG. 14 is a cross-sectional view of a semiconductor device forming a transistor in the polycrystalline layer. In this Example, since a bipolar transistor is formed, a base electrode 10, an emitter electrode 9, a collector electrode 11, etc. are formed. These electrodes are not always required to be formed nearby, and the order of the positions of them can be optional. Further, the transistor formed in the polycrystalline silicon thin film is not always limited to the bipolar transistor, and it can be a diode, or other type of transistor, and the like semiconductor device. Further, it is possible to use B or As as a dopant in place of P.

EXAMPLE 5

Figure 15:
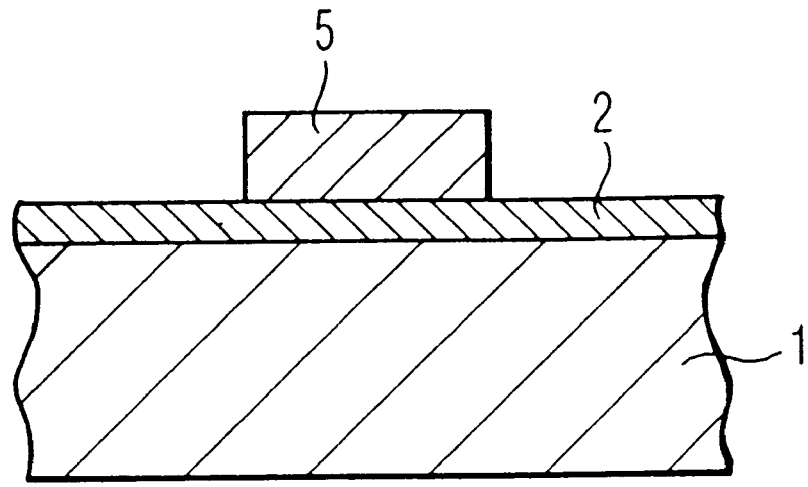
FIG. 15 is a cross-sectional view of a gate electrode according to the present invention.

This Example is explained referring to FIGS. 7 and 15. FIG. 15 is a cross-sectional view of a gate electrode in a MOS transistor obtained from the polycrystalline silicon thin film deposited according to the present invention.

In this Example, a P-doped silicon thin film is deposited using a $SiH_4$ gas on a silicon oxide film 2 formed on a silicon substrate 1 (i). First, only the raw material gas ($SiH_4$ gas) is introduced for depositing a silicon thin film (ii). After a predetermined time, a non-doped amorphous silicon layer 3 having a predetermined thickness is formed. By this, the film having an orientation in the (311) crystal plane direction is formed (iii). Then, a dopant P gas is introduced (iv). Then, a P-doped amorphous silicon film 4 is deposited continuously to obtain a predetermined thickness (v). In this case, the thickness of whole thin film and P concentration therein are made equal to the case of not positively controlling the P concentration near the interface of underlying film (vi). Subsequently, the heat treatment for crystallization is carried out to form the P-doped polycrystalline silicon film 5. By this, there is formed the polycrystalline layer having the structure shown in FIG. 15.

In this Example, since the (311) crystal plane begins to grow already in the initial non-doped layer, the growth of (311) crystal plane in the P-doped layer is continued to finally obtain a homogeneous polycrystalline film having an orientation in the (311) crystal plane direction. Since the thin film is homogeneous, the thin film is stabilized by controlling the internal stress. Further, it is possible to use B or As as a dopant in place of P.

EXAMPLE 6

This Example is explained referring to FIGS. 8 and 15. FIG. 15 is a cross-sectional view of a gate electrode in a MOS transistor obtained from the polycrystalline silicon thin film deposited according to the present invention.

As shown in FIG. 8, in this Example, a P-doped silicon thin film is deposited using a $SiH_4$ gas on a silicon oxide film 2 formed on a silicon substrate (i). First, only a P-dopant gas is introduced immediate after the beginning (ii). After a predetermined time, a P-high concentration layer 7 is formed (iii). Then, a raw material gas ($SiH_4$ gas) is introduced for depositing a silicon thin film (iv). The deposition of P-doped amorphous silicon film 4 is continued to obtain a predetermined thickness (v). In this case, the thickness of whole thin film and the average P concentration therein are made equal to the case of not positively controlling the P concentration near the interface of underlying film.

By employing this depositing method, there is formed the polycrystalline silicon thin film wherein the layer containing P in high concentration and unevenly is formed near the interface of the underlying silicon oxide film 2. By proceeding the crystal growth using the high concentration and unevenly present P as the crystal nucleuses, crystal grains having an orientation in the direction of (211) crystal plane grow. Thus, the P-doped polycrystallize silicon film 5 shown in FIG. 5 after the completion of crystallization becomes a homogeneous film having the (211) crystal plane uniformly at the thin film surface and showing a stabilized internal stress value.

In this Example, it is possible to use B or As as a dopant in place of P.

EXAMPLE 7

This Example is explained referring to FIGS. 8 and 12. In this Example, a polycrystalline silicon thin film is deposited, followed by formation of a transistor in the polycrystalline silicon thin film. FIG. 12 is a cross-sectional view of a semiconductor device in which a transistor is formed in the polycrystalline layer. FIG. 8 is a flow chart showing the steps for forming the polycrystalline silicon thin film. Further, since the step of introducing an impurity has no direct relation to the formation of the transistor, it is omitted.

As shown in FIG. 8, in this Example, a P-doped silicon thin film is formed on the silicon oxide film 2 formed on the substrate 12 made from a different material from the silicon substrate 1 (i). First, only a P dopant gas is introduced immediately after the beginning (ii). After a predetermined time, a P-high concentration layer 7 is formed (iii). Then, a raw material gas ($SiH_4$ gas) is introduced for the deposition of silicon thin film (iv). The deposition of P-doped amorphous silicon film 4 is continued to obtain a predetermined thickness (v). In this case, the thickness of whole thin film and the average P concentration therein are made equal to the case of not positively controlling the P concentration near the interface of underlying film. By employing this depositing method, there is formed the polycrystalline silicon thin film wherein after the formation of the layer containing P in high concentration near the interface of the silicon oxide film 2, the P-doped polycrystalline silicon film 5 is formed.

By proceeding the crystal growth using the P deposited in high concentration as crystal nucleuses, the crystal grains grow in the direction of (211) crystal plane. Thus, the polycrystalline film after crystallization reaction becomes a homogeneous film having an orientation in the direction of (211) crystal plane uniformly and showing a stabilized internal stress value. In this Example, it is also possible to use B or As as a dopant in place of P.

In this Example, since a bipolar transistor is formed, a base electrode 10, an emitter electrode 9, a collector electrode 11, etc. are formed. These electrodes are not always required to be formed nearby, and the order of the positions of them can be optional. Further, the transistor formed in the polycrystalline silicon thin film is not always limited to the bipolar transistor, and it can be a diode, or other type of transistor, and the like semiconductor device.

In this Example, since the non-doped layer is present near the interface of underlying film under the P-doped amorphous silicon thin film, the (211) crystal plane predominantly grows at the time of crystallization reaction by heat treatment to give a homogeneous polycrystalline layer. Further, since the P-doped silicon thin film having a stabilized internal stress values is obtained, properties of semiconductor device (e.g. transistor) formed in individual crystal grains are low in deviation and thus stabilized.

EXAMPLE 8

Figure 16:
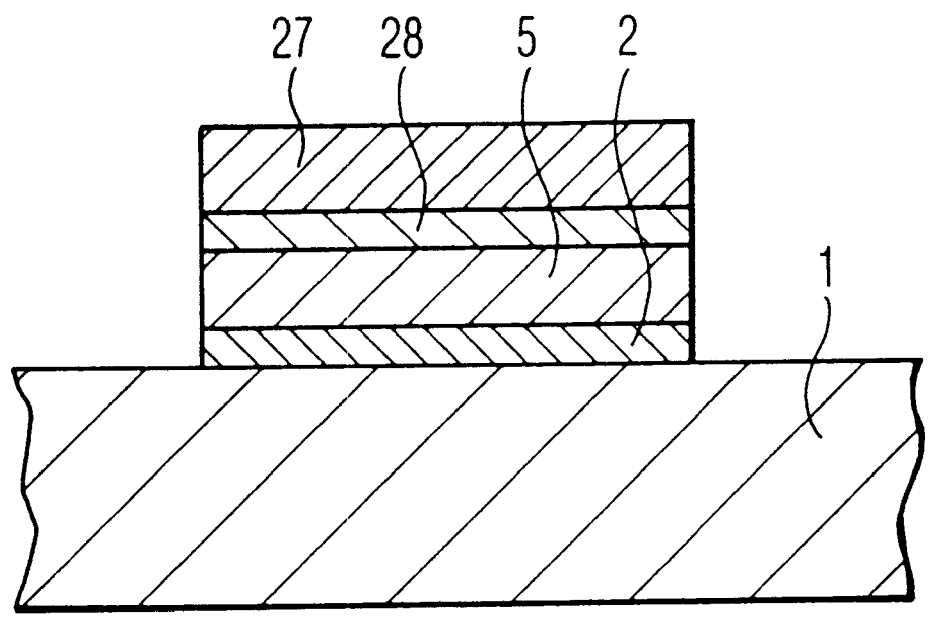
FIG. 16 is a cross-sectional view of a flash memory according to the present invention.

This Example is explained referring to FIG. 16. In this Example, the present invention is applied to a flash memory. FIG. 16 is a cross-sectional view of a flash memory, wherein numeral 27 denotes a control gate electrode, and numeral 28 denotes a polycrystalline silicon thermal oxidation film. The flash memory comprises a silicon substrate 1, a silicon oxide film 2 (a ultrathin oxidized film) formed thereon, a P-doped polycrystalline silicon film 5 formed on the silicon oxide film, a polycrystalline silicon thermal oxidation film 28 formed by thermal oxidation of the surface of the polycrystalline silicon thin film, and an electroconductive thin film 27 which is to become a control gate electrode formed on the polycrystalline silicon thermal oxidation film 28.

The P-doped polycrystalline silicon film 5 can be produced either by producing the non-doped layer near the interface of underlying oxide film as described in Example 1, or by producing the P-high concentration doper layer as described in Example 2. In either case, the resulting P-doped polycrystalline silicon film has an orientation in an almost uniform direction as explained previously.

In the case of forming the silicon oxidation film 28 by thermal oxidation of the surface of the P-doped polycrystalline silicon thin film 5, since the polycrystalline thin film has an almost uniform direction of crystal plane, the thickness of the thermal oxidation film grown on individual grains becomes uniform. This is a result of losing an influence of the anisotropy wherein the growth speed of oxidation film is different in crystal plane directions, in the case of thermal oxidation of silicon crystals. Thus, it is possible to obtain the uniform film thickness.

In this Example, only the thermal oxidation film 28 is formed between the P-doped polycrystalline silicon film 5 and the control gate electrode 27, but in order to enhance a dielectric constant, it is possible to form a silicon nitride film or a laminate of a silicon nitride film and a silicon oxide film between the thermal oxidation film 28 and the control gate electrode 27. It is also possible to use B or As as a dopant in place of P.

In this Example, since the film thickness of the thermal oxidation film can be formed uniformly locally (in the unit of each crystal grain) between the P-doped polycrystalline silicon film 5 and the control gate electrode 27, it is possible to control the variation of pressure resistance caused by variation in the oxidation film thickness and to design the thickness of the oxidation film as thin as possible.

EXAMPLE 9

Figure 17:
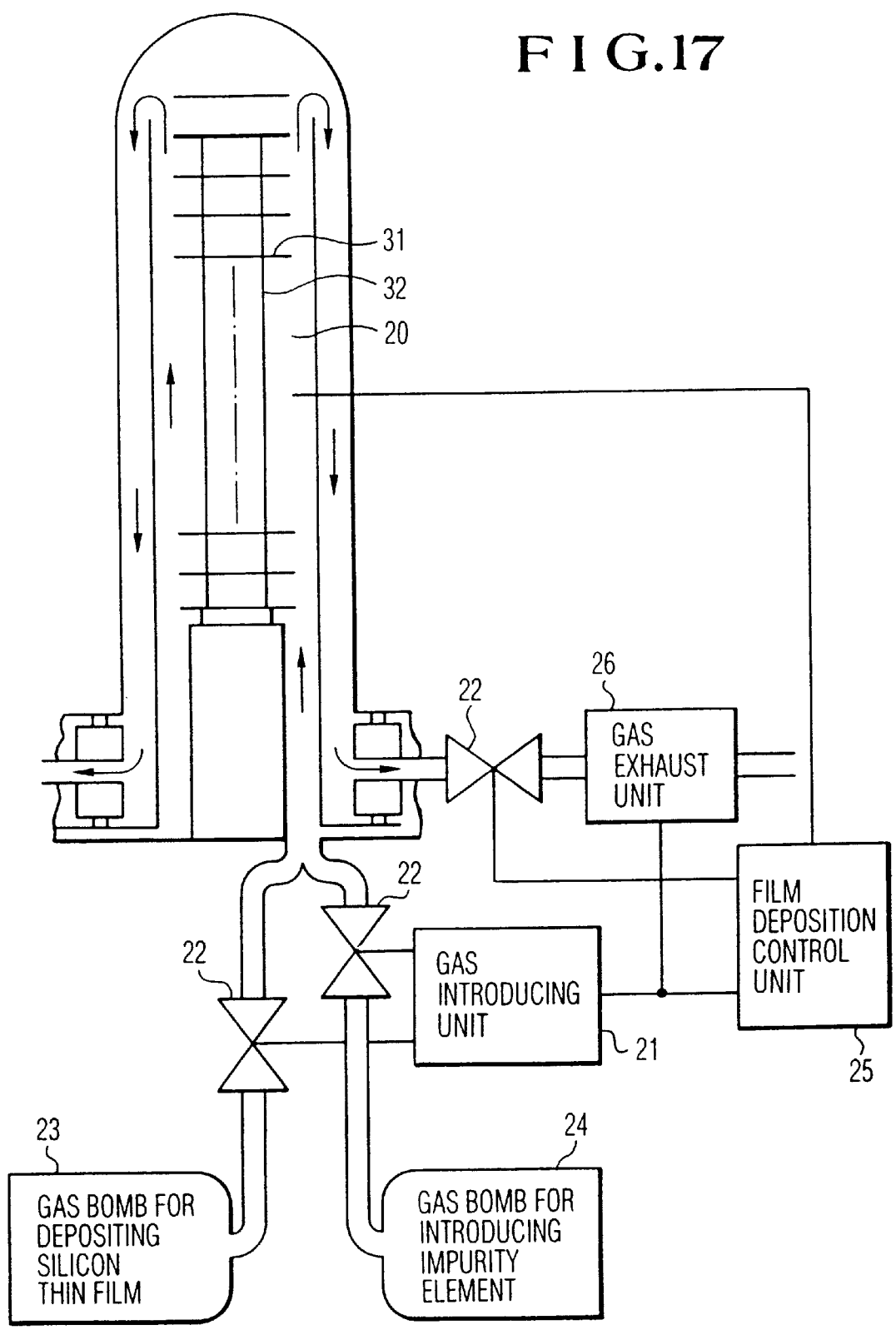
FIG. 17 is a schematic view of a chemical vapor deposition apparatus according to the present invention.

This Example is explained referring to FIGS. 7, 8 and 17. This Example shows a structure of apparatus for depositing the thin film realizing the thin film deposited structure and deposition process of the present invention. FIG. 17 is a schematic view of a chemical vapor deposition (CVD) apparatus, wherein numeral 20 denotes a reaction chamber for depositing the thin film, numeral 21 denotes a gas introducing unit, numeral 22 denotes a gas flow control valve, numeral 23 denotes a gas bomb for depositing a silicon thin film, numeral 24 denotes a gas bomb for introducing an impurity element, numeral 25 denotes a film deposition control unit in the reaction chamber, numeral 26 denotes a gas exhaust unit, numeral 31 is a wafer and numeral 32 is a board. In FIG. 17, an upright type CVD apparatus is shown (a heater is not shown in the drawing), but it is possible to use a lateral type CVD apparatus or a sheet treating type.

In the reaction chamber 20, the wafer 31 is placed on the board 32. The film deposition control unit 25 is to control the temperature in the reaction chamber, and to control transport of a substrate on which the thin film is to be deposited. The gas bomb 23 is used for storing the raw material gas (e.g. $SiH_4$ gas or $Si_2H_6$ gas) for depositing the silicon thin film. The gas bomb 24 is used for storing the impurity gas as a dopant such as P, B, As, etc.

The gas introducing unit 21 controls the timing of introducing each gas into the reaction chamber 20 and the timing of opening or closing the gas flow control valve 22 for depositing the P-doped silicon thin film according to the process shown in FIG. 7 or FIG. 8.

In FIG. 17, each one path for introducing the raw material gas and the impurity gas is shown, but it is possible to use a plurality of pipes for introducing these gases into the reaction chamber 20. In either case, the gas introduction paths and gas introduction timing should be controlled by the gas introducing unit 21. In this apparatus, the impurity-doped silicon thin film can be either an amorphous silicon layer or a polycrystalline silicon layer.

By using the apparatus shown in FIG. 17, it is possible to form the non-doped layer or the impurity-high concentration layer can be formed near the interface of the underlying film. Thus, it becomes possible to control the crystal orientation of the polycrystalline silicon thin film, resulting in obtaining the homogeneous silicon thin film having a stabilized internal stress value in a high yield with stably.

In the above Examples, the crystal orientation of (311) plane, (211) plane or (111) plane is illustrated but not limited thereto. The crystal plane can also include the (100) plane, (110) plane, and the like.

As mentioned above, the polycrystalline silicon thin film and the semiconductor device using the silicon thin crystal can be controlled to have an almost uniform crystal plane direction, thus the homogeneous polycrystalline silicon thin film having a stabilized internal stress value can be produced stably in a high yield.

What is claimed is:

1. A process for producing a semiconductor device having a silicon thin film with an average impurity concentration, which comprises forming an underlying film on a semiconductor substrate, forming an impurity layer from an impurity gas selected from group III and V elements, said impurity layer having a higher concentration of impurity than said average impurity concentration, and depositing a silicon film, from a $SiH_4$ gas or a $Si_2H_6$ gas, doped with the impurity, for forming said silicon thin film.

2. A process for producing a semiconductor device having a polycrystalline thin film with an average impurity concentration, which comprises forming an underlying film on a semiconductor substrate, forming an impurity layer from an impurity gas selected from group III and V elements, said impurity layer having a higher concentration of impurity than said average impurity concentration, depositing an amorphous silicon film, from a $SiH_4$ gas or a $Si_2H_6$ gas, doped with the impurity, and heat treating the amorphous silicon thin film to give said polycrystalline silicon thin film.

3. A process for producing a silicon thin film having an average impurity concentration, which comprises introducing into a reaction chamber an impurity gas selected from group III and V elements to form an impurity layer having a higher impurity concentration than said average impurity concentration, and introducing a raw material gas selected from $SiH_4$ gas and $Si_2H_6$ gas together with the impurity gas to deposit a silicon thin layer doped with the impurity, for forming said silicon thin film having said average impurity concentration.

4. A process for producing a polycrystalline silicon thin film having an average impurity concentration, which comprises introducing into a reaction chamber an impurity gas selected from group III and V elements to form an impurity layer having a higher impurity concentration than said average impurity concentration, and introducing a raw material gas selected from $SiH_4$ gas and $Si_2H_6$ gas together with the impurity gas to deposit an amorphous silicon thin film doped with the impurity, and heat treating the amorphous silicon thin film to provide said polycrystalline silicon thin film having said average impurity concentration.

* * * * *